(12) United States Patent
Tseng et al.

(10) Patent No.: US 6,775,918 B2
(45) Date of Patent: Aug. 17, 2004

(54) WAFER CASSETTE POD EQUIPPED WITH POSITION SENSING DEVICE

(75) Inventors: Hisen-Hwa Tseng, Pintung (TW); Chia-Hung Chung, Tainan (TW); Ming-Chien Wen, Hsin-Chu (TW)

(73) Assignee: Taiwan Semiconductor Manufacturing Co., Ltd, HsinChu (TW)

( * ) Notice: Subject to any disclaimer, the term of this patent is extended or adjusted under 35 U.S.C. 154(b) by 196 days.

(21) Appl. No.: 10/072,243

(22) Filed: Feb. 6, 2002

(65) Prior Publication Data

US 2003/0146129 A1 Aug. 7, 2003

(51) Int. Cl.[7] .................. G01D 21/00; B65D 85/30; B65G 49/07
(52) U.S. Cl. .................... 33/645; 33/613; 206/711; 414/940
(58) Field of Search .................... 33/613, 645, 533; 414/936, 937, 938, 939, 940; 206/711, 710, 454, 832, 833

(56) References Cited

U.S. PATENT DOCUMENTS

| | | | | |
|---|---|---|---|---|
| 5,138,772 A | * | 8/1992 | Barnes | ............... 33/613 |
| 5,386,641 A | * | 2/1995 | Hladovcak | ............... 33/645 |
| 5,970,621 A | * | 10/1999 | Bazydola et al. | ............... 33/613 |
| 6,141,885 A | * | 11/2000 | Ishitani et al. | ............... 33/645 |
| 6,389,707 B1 | * | 5/2002 | Peiter et al. | ............... 33/645 |
| 6,425,722 B1 | * | 7/2002 | Ueda et al. | ............... 414/936 |
| 6,530,736 B2 | * | 3/2003 | Rosenquist | ............... 414/940 |
| 6,573,522 B2 | * | 6/2003 | Elliott et al. | ............... 414/940 |
| 2001/0014271 A1 | * | 8/2001 | Si et al. | ............... 414/937 |

* cited by examiner

Primary Examiner—Diego Gutierrez
Assistant Examiner—Madeline Gonzalez
(74) Attorney, Agent, or Firm—Tung & Associates

(57) ABSTRACT

A wafer cassette pod that is equipped with at least one position sensing device to avoid the accidental falling of a cassette pod door resulting in wafer breakage. The wafer cassette pod is provided with at least one position sensing device mounted in the sidewall of the cassette pod with a finger member protruding from the end surface of the sidewall forming the cassette pod opening. When the wafer cassette pod is not properly positioned, or docked on the loadport, the spring force of the position sensing device pushes the cassette pod away from the entrance of the loadport and thus, preventing the accidental falling of a cassette pod poor resulting in possible wafer breakage problems.

10 Claims, 3 Drawing Sheets

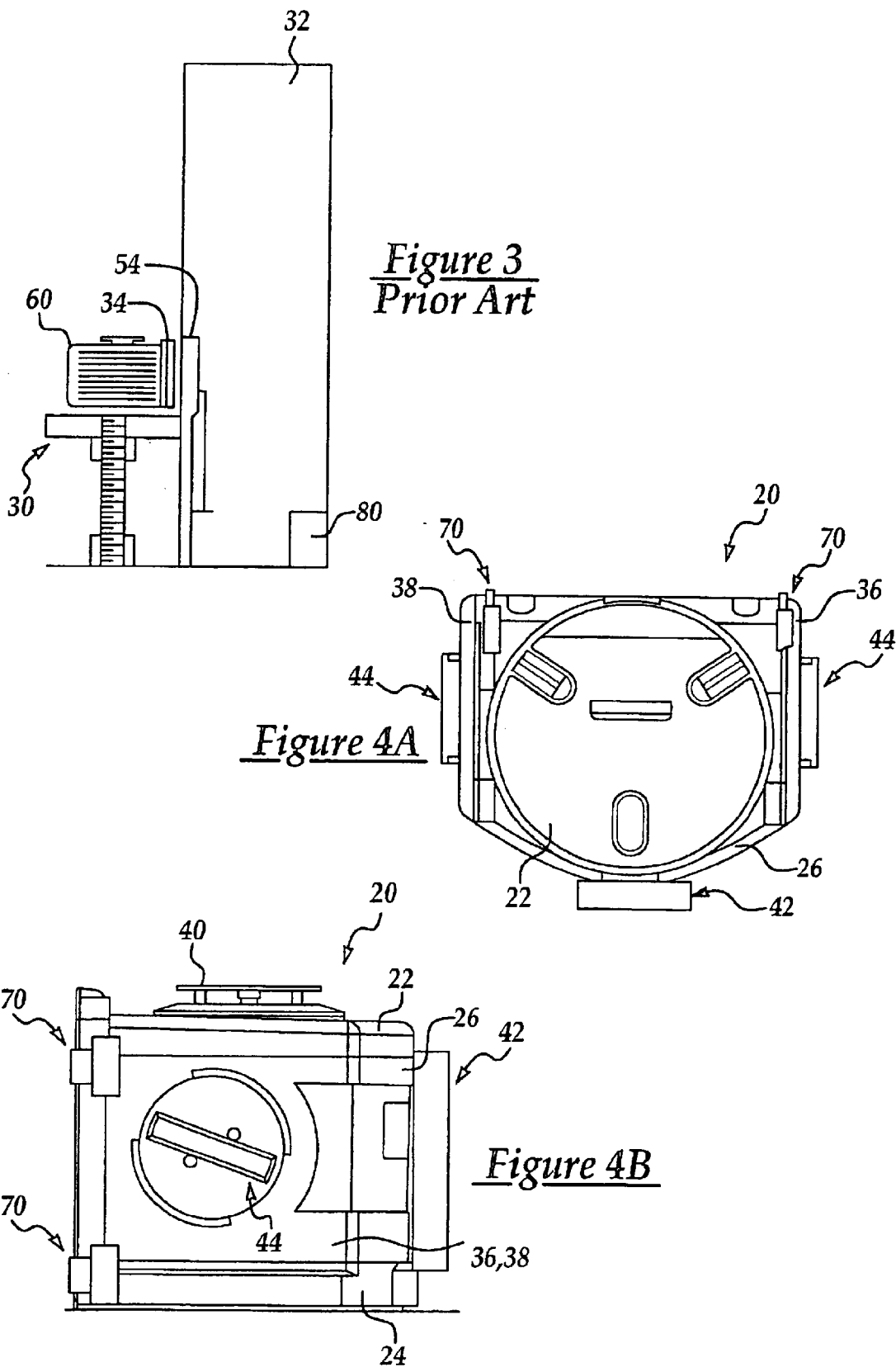

WAFER CASSETTE POD EQUIPPED WITH POSITION SENSING DEVICE

FIELD OF THE INVENTION

The present invention generally relates to a wafer cassette for storing wafers and more particularly, relates to a wafer cassette pod for storing wafers that is equipped with a position sensing device for ensuring proper positioning on a loadport.

BACKGROUND OF THE INVENTION

In the manufacturing of a semiconductor device, the device is usually processed at many work stations or processing machines. The transporting or conveying of a partially finished device, or a work-in-process (WIP) part, is an important aspect in the total manufacturing process. The conveying of semiconductor wafers is especially important in the manufacturing of integrated circuit chips due to the delicate nature of the chips. Furthermore, in fabricating an IC product, a multiplicity of fabrication steps, i.e. as many as several hundred, is usually required to complete the fabrication process. A semiconductor wafer or IC chips must be stored or transported between various process stations in order to perform various fabrication processes.

For instance, to complete the fabrication of an IC chip, various steps of deposition, cleaning, ion implantation, etching and passivation steps must be carried out before an IC chip is packaged for shipment. Each of these fabrication steps must be performed in a different process machine, i.e. a chemical vapor deposition chamber, an ion implantation chamber, an etcher, etc. A partially processed semiconductor wafer must be conveyed between various work stations many times before the fabrication process is completed. The safe conveying and accurate tracking of such semiconductor wafers or work-in-process parts in a semiconductor fabrication facility is therefore an important aspect of the total fabrication process.

Conventionally, partially finished semiconductor wafers or WIP parts are conveyed in a fabrication plant by automatically guided vehicles or overhead transport vehicles that travel on predetermined routes or tracks. For the conveying of semiconductor wafers, the wafers are normally loaded into cassettes pods, such as SMIF (standard machine interface) or FOUP (front opening unified pod), and then picked up and placed in the automatic conveying vehicles. For identifying and locating the various semiconductor wafers or WIP parts being transported, the cassettes or pods are normally labeled with a tag positioned on the side of the cassette or pod. The tags can be read automatically by a tag reader that is mounted on the guard rails of the conveying vehicle.

An OHT system is frequently used to deliver a cassette pod such as a FOUP to a process machine. This is shown in FIG. 1. A cassette pod 10 of the FOUP type is positioned on a loadport 12 of a process machine 14. The loadport 12 is equipped with a plurality of locating pins 16 for the proper positioning of the cassette pod 10. A detailed perspective view of the FOUP 10 is shown in FIG. 2. The FOUP 10 is constructed by a body portion 18 and a cover portion 28. The body portion 18 is provided with a cavity 46 equipped with a multiplicity of partitions 48 for the positioning of 25 wafers of the 300 mm size. The body portion 18 is further provided with sloped handles 50 on both sides of the body for ease of transporting. On top of the body portion 18, is provided with a plate member 52 for gripping by a transport arm (not shown) of the OHT system (not shown).

FIG. 3 is a side view of a conventional loadport with a FOUP positioned on top for loading wafer into a process machine.

The loadport 30 is part of a semiconductor process equipment 32 which includes a cassette door opener 54 for opening cassette door 34 and for accessing a wafer cassette pod, i.e. a FOUP 60. Problems in operating the FOUP cassette door frequently occurs when the door is not latched in an open position and thus, may accidentally drop onto the wafers which are not properly positioned. The falling cassette door can easily break the wafers when contacted with an impact force. This occurs when the FOUP is not properly docked on the loadport, or when the cassette door is not properly attached to the FOUP.

It is therefore an object of the present invention to provide a wafer cassette pod for docking onto a loadport that does not have the drawbacks or shortcoming of the conventional cassettes.

It is another object of the present invention to provide a wafer cassette pod for docking onto a loadport wherein the accidental falling of a cassette door on the wafers can be avoided.

It is a further object of the present invention to provide a wafer cassette pod that is equipped with at least one position sensing device for preventing breakage of wafers by the cassette door.

It is another further object of the present invention to provide a wafer cassette pod that is equipped with at least one position sensing device capable of separating the cassette from the docking door when the cassette is not properly positioned.

It is still another object of the present invention to provide a wafer cassette pod that is equipped with at least one spring-loaded position sensing device mounted in the sidewall of the cassette with fingers exposed.

SUMMARY OF THE INVENTION

In accordance with the present invention, a wafer cassette pod that is equipped with a position sensing device for preventing wafer breakage by a falling cassette door is provided.

In a preferred embodiment, a wafer cassette pod that is equipped with a position sensing device is provided which includes a cassette pod body formed of a top panel, a bottom panel, a front panel and two side panels; a rear opening in the cassette pod body formed by the top panel, the bottom panel and the two side panels for receiving wafers therethrough, the two side panels further include recessed slots on inside surfaces for positioning the wafers; and at least two spring-loaded position sensing devices each mounted in one of the two side panels with a finger protruding beyond an end surface of the side panel to push the cassette pod body away from a loadport of a process machine when the cassette pod body is not properly positioned on the loadport.

In the wafer cassette pod that is equipped with a position sensing device, the at least two spring-loaded position sensing devices are four position sensing devices with two mounted in each side panel. The at least two spring-loaded position sensing devices may each include a case that has an opening on a front side; a finger protruding through the opening of the case; and at least one spring pushing the finger outwardly away from the case. The two spring-loaded position sensing devices are mounted in a side panel with one near the top and the other near the bottom. Each of the at least two spring-loaded position sensing devices is further equipped with a connecting node mounted on the finger for making electrical connection with a sensor and for sending out a signal to a process controller when the connection is not made.

In the wafer cassette pod equipped with a position sensing device, the two side panels may further include slot openings in the end surface for mounting the at least two spring-loaded position sensing devices. The two side panels may further include slot openings in the end surface for frictionally engaging the at least two spring-loaded position sensing devices. The at least two spring-loaded position sensing devices each equipped with a spring that has a spring constant sufficiently large to push a fully loaded wafer cassette pod away from an opening of the loadport. The finger on the position sensing device may be loaded by two springs, or may be loaded by three springs.

BRIEF DESCRIPTION OF THE DRAWINGS

These and other objects, features and advantages of the present invention will become apparent from the following detailed description and the appended drawings in which:

FIG. 3 is a side view of a conventional wafer cassette pod positioned on the loadport of a process machine wherein the ladport is equipped with a cassette door closer.

FIG. 4A is top view of the present invention wafer cassette pod equipped with the position sensing device.

FIG. 4B is a side view of the present invention wafer cassette pod illustrating the position sensing devices mounted at the bottom and at the top of a sidewall panel.

DETAILED DESCRIPTION OF THE PREFERRED AND ALTERNATE EMBODIMENTS

Figure 1:
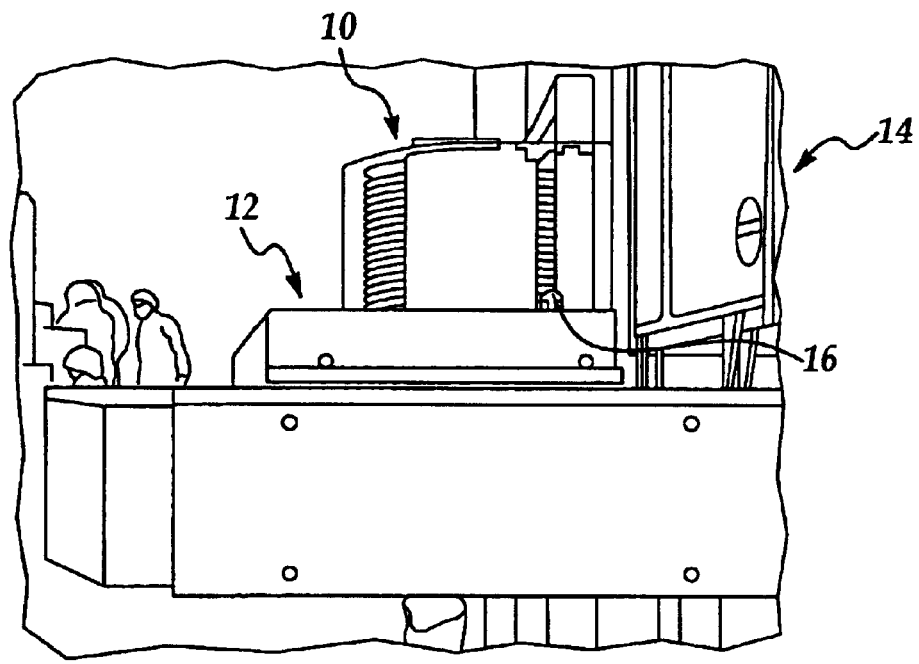
FIG. 1 is a perspective view of a conventional wafer cassette pod mounted on the loadport of a process machine.
Figure 2:
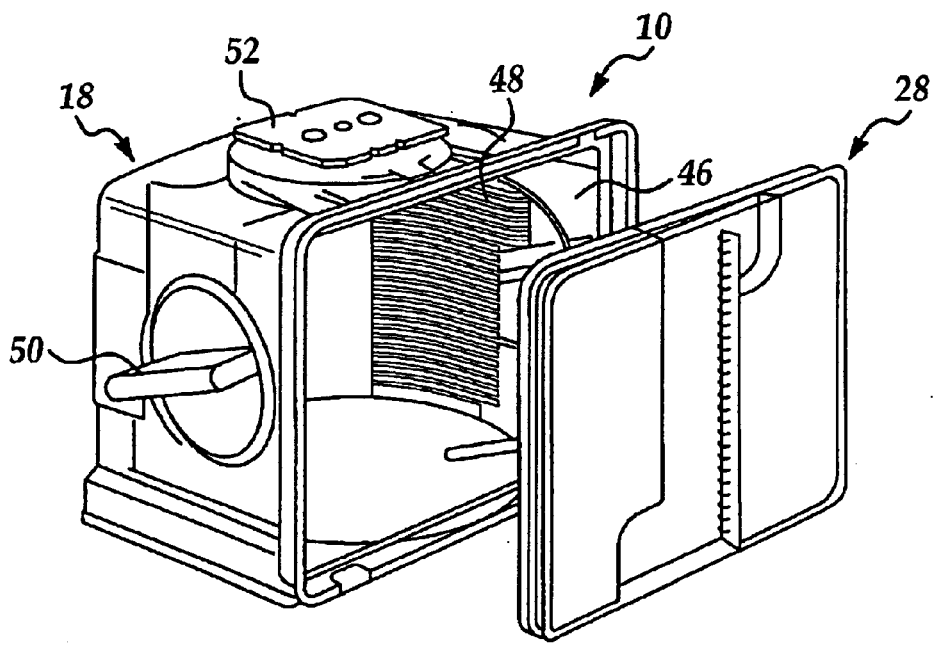
FIG. 2 is a perspective view of a conventional wafer cassette pod with a cassette door positioned adjacent thereto.

The present invention discloses a wafer cassette pod that is equipped with a position sensing device such that the accidental drop of a cassette pod door onto wafers stored in the cassette pod can be avoided. When the wafer cassette pod is not properly positioned on a loadport, the spring-loaded position sensing device through an exposed finger pushes against the loadport such that the cassette pod separates away from the opening entrance of the loadport to avoid wafer breakage by a falling cassette pod door.

The wafer cassette pod body is equipped with at least two position sensing devices mounted in the side panels. Preferably, two position sensing devices are mounted in each one of the side panels in an up and down manner so that one position sensing device is mounted at near the bottom of the sidewall, while the other is mounted at near the top of the sidewall. The position sensing device can be constructed by a case, a finger protruding from the case, and at least one spring pushing the finger outwardly away from the case.

Referring now to FIG. 4A, wherein a top view of the present invention wafer cassette pod 20 is shown. The wafer cassette pod 20 is generally formed of a polymeric material and can be advantageously molded of a substantially clear plastic material. A side view of the present invention wafer cassette pod 20 is shown in FIG. 4B.

As shown in FIGS. 4A and 4B, the present invention wafer cassette pod 20 is constructed with a top panel 22, a bottom panel 24, a front panel 26 and two side panels 36,38. A bracket 40 is further provided on the top panel 22 for transporting by an overhead transporting vehicle. On the front panel 26, is further mounted an identification device 42, commonly known as a smart tag. On the two side panels 36,38, is further mounted a handle 44 for transporting the wafer cassette pod 20 by hand.

In the sidewall panels 36,38, a spring-loaded position sensing device 70 is mounted. At least two of such devices should be mounted on each wafer cassette pod 20, for instance, with one mounted in each side panel 36,38. Preferably, four position sensing devices 70 should be mounted with two in each side panels 36,38. This is shown in FIGS. 4A and 4B.

Figure 5A:
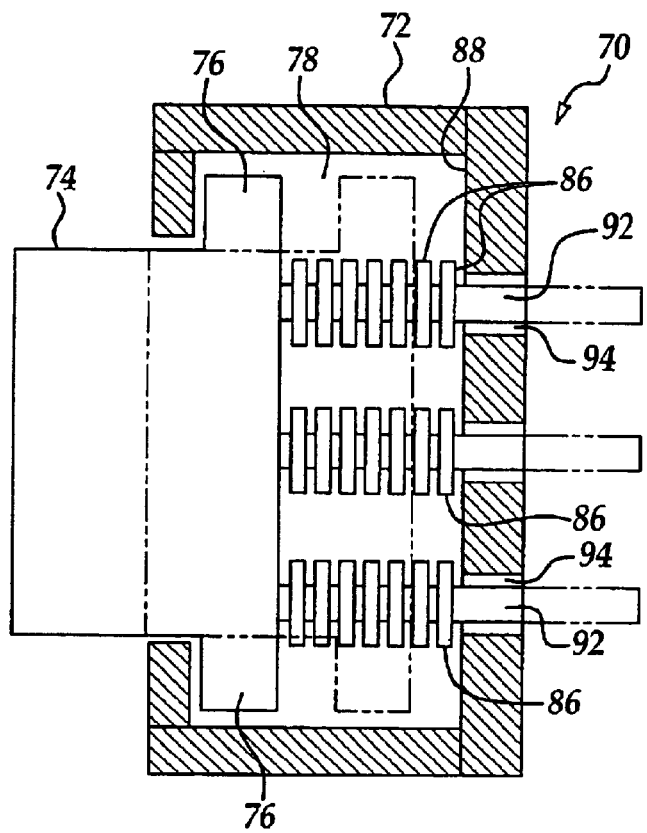
FIG. 5A is an enlarged, cross-sectional view of a present invention spring-loaded position sensing device.
Figure 5B:
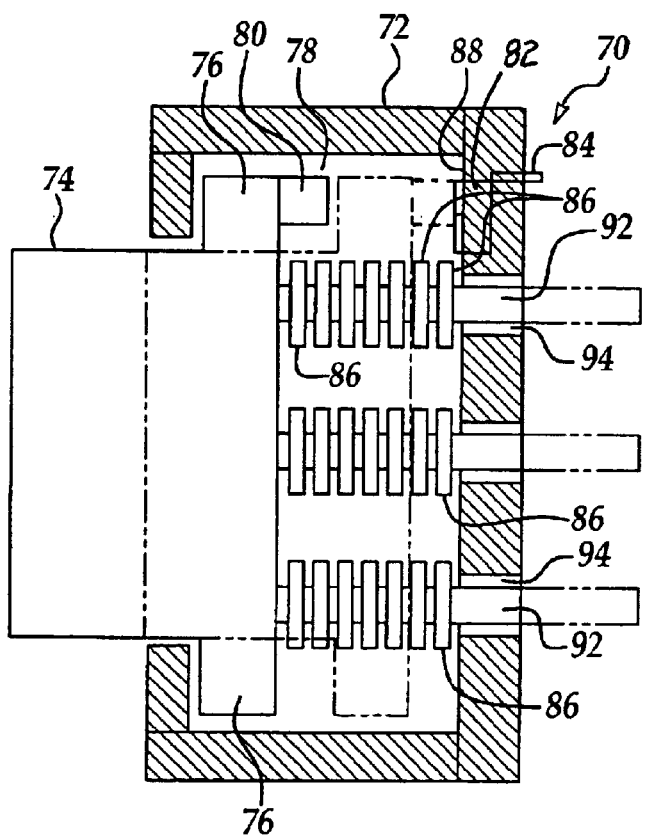
FIG. 5B is an enlarged, cross-sectional view of a second embodiment of the present invention position sensing device equipped with a connecting node and a sensor.

Detailed construction of the spring-loaded position sensing device 70 is shown in FIG. 5A, in a preferred embodiment, and in FIG. 5B, in an alternate embodiment. In the preferred embodiment, shown in FIG. 5A, a case 72 is first provided. The outside surfaces of the case 72 is used to frictionally engage a slot opening (not shown) provided in the sidewall panels 36,38. A typical dimension for the case 72 may be 1.5~2.0 cm in depth, and about 5 cm in height. The width of the case 72 should be smaller than the thickness of the sidewall panels 36,38, for instance, smaller than 1.0 cm.

Inside the case 72, is mounted a finger, or a sliding plate member 74 which slides in a track (not shown) and is equipped with a skirt section 76 for retaining the finger 74 partially inside the cavity 78 of the case 72. In the alternate embodiment shown in FIG. 5B, a connecting node 80 is further provided on the finger member 74. The connecting node 80 makes electrical connection with sensor 82 when the finger member 74 is fully retracted into the cavity 78 of the case 72, i.e. when the wafer cassette pod 20 is properly docked on the loadport. When the connecting node 80 is not electrically connected to sensor 82, a signal is sent to the smart tag controller 42 through wire 84.

As shown in FIGS. 5A and 5B, the spring member 74, while sliding in a track (not shown) is mounted to at least one spring 86 acting against an inner surface 88 of the case 72 when the finger member 74 is pushed in, or in a fully recessed position. It should be noted that while, as shown in FIGS. 5A and 5B, three springs 86 are utilized, any other suitable number of springs such as one or two may also be used. The spring 86 should have a spring constant that is sufficiently large such that even at one spring, the spring constant is sufficiently to push a fully loaded wafer cassette pod (for instance a wafer cassette pod loaded with twenty-five 200 mm wafers) away from the opening of the loadport. Any accidental falling of a cassette door thus will not damage any wafers stored in the wafer cassette pod.

In the alternate embodiment shown in FIG. 5B, when the connecting node 80 and the sensor 82 are not electrically connected, a signal is sent to the smart tag indicator 42 to show that a malfunction in docking has occurred to warn the machine operator either with a flashing light or with a siren.

The springs 86 are mounted on shafts 92 through apertures 94 for guiding the finger member 74 in a linear movement into and out of the cavity 78 of the case 72. Any other suitable guiding device may also be utilized to achieve the same desirable result.

The present invention novel spring-loaded position sensing device can thus push the cassette door away from the cassette pod to avoid wafer breakage by a falling cassette pod door. When the cassette pod door is attached to the cassette pod, or the cassette is docked properly onto the loadport, the finger member 74 is fully retracted into case 72 indicating a normal operating condition. When the cassette door is not attached to the cassette, the finger member 74 protrudes out from case 72 due to the force of spring 86. The spring 86 can thus push the cassette pod away from the opening entrance of the loadport to avoid wafer breakage by a falling cassette pod door.

The present invention novel wafer cassette pod equipped with position sensing devices and a method for operating the cassette pod have therefore been amply described in the above description and in the appended drawings of FIGS. 4A–5B.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A wafer cassette pod equipped with a position sensing device comprising:
   a cassette pod body formed of a top panel, a bottom panel, a front panel and two side panels;
   a rear opening in said cassette pod body formed by said top panel, said bottom panel and said two side panels for receiving wafers therethrough, said two side panels further comprises recessed slots on inside surfaces for positioning said wafers; and
   at least two spring-loaded position sensing devices each mounted in one of said two side panels with a finger protruding beyond an end surface of said side panel to push said cassette pod body away from a loadport of a process machine when said cassette pod body is not properly positioned on said loadport.

2. A wafer cassette pod equipped with a position sensing device according to claim 1, wherein said at least two spring-loaded position sensing devices are four position sensing devices with two mounted in each side panel.

3. A wafer cassette pod equipped with a position sensing device according to claim 1, wherein said at least two spring-loaded position sensing devices each comprises:
   a case having an opening in a front side;
   said finger protruding through said opening of the case; and
   at least one spring pushing said finger outwardly away from said case.

4. A wafer cassette pod equipped with a position sensing device according to claim 1, wherein said two spring-loaded position sensing devices are mounted in a side panel with one near the top and the other near the bottom.

5. A wafer cassette pod equipped with a position sensing device according to claim 1, wherein each of said at least two spring-loaded position sensing devices is further equipped with a connecting node mounted on said finger for making electrical connection with a sensor and for sending out a signal to a process controller when said connection is not made.

6. A wafer cassette pod equipped with a position sensing device according to claim 1, wherein said two side panels further comprises slot openings in said end surface for mounting said at least two spring-loaded position sensing devices.

7. A water cassette pod equipped with a position sensing device according to claim 1, wherein said two side panels further comprises slot openings in said end surface for frictionally engaging said at least two spring-loaded position sensing devices.

8. A wafer cassette pod equipped with a position sensing device according to claim 1, wherein said at least two spring-loaded position sensing devices each equipped with a spring that has a spring constant sufficiently large to push a fully loaded wafer cassette pod away from an opening of said loadport.

9. A wafer cassette pod equipped with a position sensing device according to claim 1, wherein said finger on said position sensing device is loaded by two springs.

10. A wafer cassette pod equipped with a position sensing device according to claim 1, wherein said finger on said position sensing device is loaded by three springs.

* * * * *